(12) United States Patent
Otremba

(10) Patent No.: US 8,044,523 B2
(45) Date of Patent: Oct. 25, 2011

(54) SEMICONDUCTOR DEVICE

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/157,691

(22) Filed: Jun. 21, 2005

(65) Prior Publication Data

US 2006/0017174 A1 Jan. 26, 2006

(30) Foreign Application Priority Data

Jun. 22, 2004 (DE) .......................... 10 2004 030 042

(51) Int. Cl.
*H01L 23/48* (2006.01)
(52) U.S. Cl. . 257/786; 257/778; 257/779; 257/E23.004; 257/E23.015; 438/612
(58) Field of Classification Search ................. 257/779, 257/E23.021, 777, 786; 438/612
See application file for complete search history.

(56) References Cited

U.S. PATENT DOCUMENTS

| | | | | |
|---|---|---|---|---|
| 4,341,594 A | * | 7/1982 | Carlson et al. | 438/704 |
| 5,154,341 A | * | 10/1992 | Melton et al. | 228/180.22 |
| 5,251,806 A | * | 10/1993 | Agarwala et al. | 228/180.22 |
| 5,418,553 A | * | 5/1995 | Connolly | 347/200 |
| 5,470,787 A | * | 11/1995 | Greer | 438/614 |
| 6,198,166 B1 | * | 3/2001 | Coronati | 257/738 |
| 6,313,540 B1 | * | 11/2001 | Kida et al. | 257/784 |
| 6,569,764 B1 | | 5/2003 | Hirashima et al. | |
| 6,596,619 B1 | * | 7/2003 | Wang et al. | 438/612 |
| 6,762,067 B1 | | 7/2004 | Quinones et al. | |
| 6,774,466 B1 | * | 8/2004 | Kajiwara et al. | 257/673 |
| 2003/0075785 A1 | | 4/2003 | Crowley et al. | |
| 2003/0214029 A1 | * | 11/2003 | Tao et al. | 257/723 |
| 2003/0214036 A1 | * | 11/2003 | Sarihan et al. | 257/738 |

FOREIGN PATENT DOCUMENTS

| | | |
|---|---|---|
| DE | 26 58 532 A1 | 6/1978 |
| GB | 1 563 870 A | 4/1980 |
| WO | 01/24260 | 4/2001 |
| WO | 2004/032198 | 4/2004 |

OTHER PUBLICATIONS

Andrew Sawle et al., "Direct FET™ A Proprietary New Source Mounted Power Package for Board Mounted Power", Jun. 2004 (6 pgs.).
Fairchild Semiconductor "FDZ5045N—30V N-Channel Logic Level PowerTrench BGA-MOSFET", Dec. 1999 (4 pages).
International Rectifier, DirectFET Power MOSFET, PD-94366A, Jan. 21, 2002 (9 pgs.).

* cited by examiner

*Primary Examiner* — Matthew E Warren
*Assistant Examiner* — John Lin
(74) *Attorney, Agent, or Firm* — Dicke, Billig & Czaja, PLLC

(57) ABSTRACT

The invention relates to a semiconductor device with a semiconductor chip, on which a terminal contact formed in one piece, a patterned metallization layer, contacting the terminal contact, and a connecting layer are successively arranged, the patterned metallization layer and the patterned connecting layer forming an electrically conducting contact layer.

16 Claims, 5 Drawing Sheets

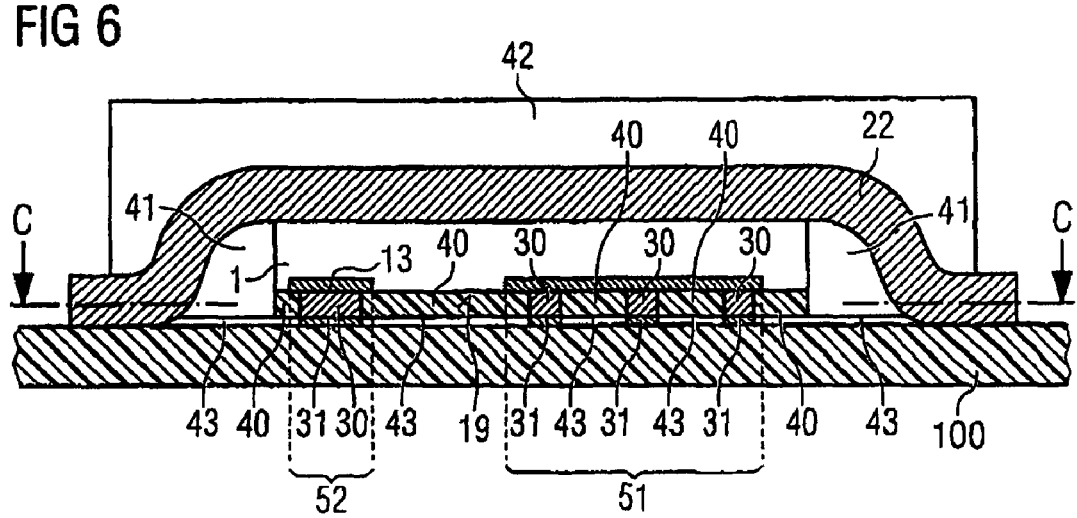
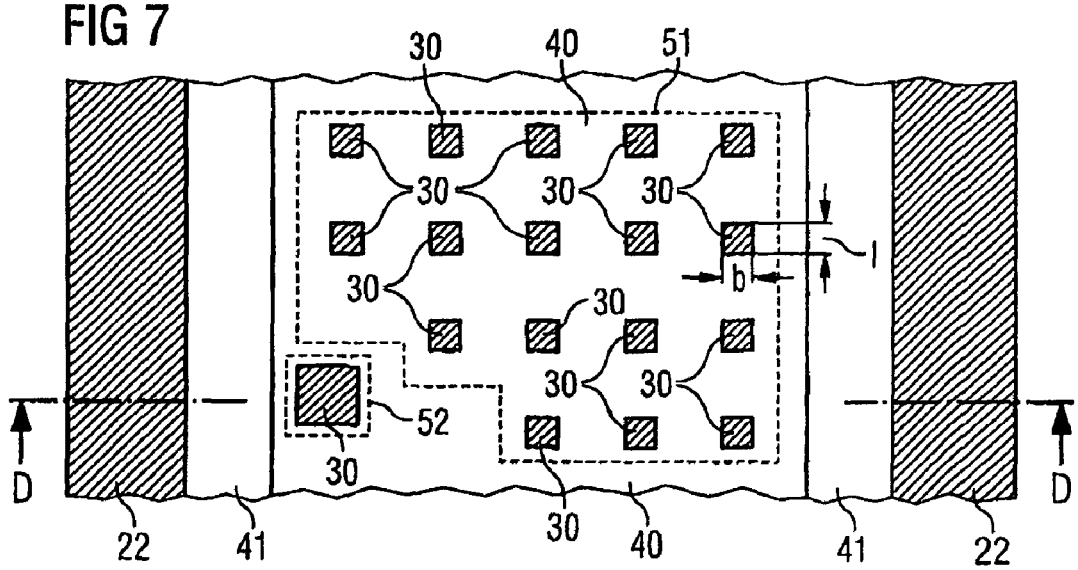

SEMICONDUCTOR DEVICE

CROSS-REFERENCE TO RELATED APPLICATIONS

This Utility Patent Application claims priority to German Patent Application No. 10 2004 030 042.9-33, filed on Jun. 22, 2004, which is incorporated herein by reference.

FIELD OF THE INVENTION

The invention relates to a semiconductor device produced by a flip-chip technique, with a semiconductor chip.

BACKGROUND

Flip-chip technologies are used in particular whenever the space required for the redistribution routing of the semiconductor chip is to be optimized. In this case, generally a number of terminal contacts arranged on one side of the semiconductor chip are connected in an electrically conducting manner to a carrier.

The carrier may be formed for example as a metallic chip carrier and as such be a component part of the semiconductor device.

However, it is similarly possible for the carrier to be formed as a printed circuit board, for example as a PCB substrate, on which one or more semiconductor devices are mounted in a flip-chip arrangement. In this case, the substrate is not a component part of the semiconductor device. On arrangement of this type, provided by International Rectifier of El Segunda, Calif., 90245, USA, under the trade name "Direct-FET", includes a semiconductor device which has on one side solderable metallizations, which are soldered over their entire surface area to corresponding metallizations of a printed circuit board.

FIG. 1 illustrates a portion of a semiconductor device according to the prior art with a terminal contact 10 formed in one piece. The semiconductor chip 1 represented is shown by way of example as a MOSFET.

The semiconductor chip 1 includes a heavily n-doped drain zone 11, on which a lightly n-doped drift zone 14 is arranged. Embedded in the drift zone 14 are a number of p-doped body zones 15, in which highly n-doped source zones 16 are in turn embedded. The body zones 15 and the source zones 16 are arranged on the side of the drift zone 14 that is facing away from the drain zone 11. A gate electrode 12 is arranged such that it is insulated from the semiconductor zones 14, 15, 16 by an insulating layer 17. A metallization 10, formed in one piece, contacts the various source zones 16 and forms their terminal contact 10. The terminal contact 10 is substantially of a flat form and insulated from the gate electrode 12. The gate electrode 12 is in this case configured in such a way that there are clearances for the terminal contact 10 to the source zones 16.

A reduced representation of the semiconductor chip 1 according to FIG. 1 is schematically represented in FIG. 2. The semiconductor chip 1 has on its front side 19 terminal contacts 10, 13 formed over its full surface area and in one piece. The terminal contact 10 corresponds to the terminal contact 10 already known from FIG. 1 and is connected in an electrically conducting manner and over its full surface area to the source zones 16 represented there. A further terminal contact 13 represents the gate terminal of the semiconductor chip 1, which is connected in an electrically conducting manner to the gate electrode 12 represented in FIG. 1. The connection of such a semiconductor chip 1 to a substrate usually takes place by means of a solder layer applied to the terminal contact 10 over its full surface area.

An arrangement of this type has the disadvantage that the considerable heat loss produced in particular in the case of power semiconductor devices in the semiconductor chip is transferred via the solderable metallization areas to the solder layer and the printed circuit board. As a result, the temperature of the solder can rise above its melting point, which may lead to impairment of the soldered connection concerned.

Instances of damage to the printed circuit board can similarly occur if its temperature reaches excessively high values. For example, FR4, a material typically used for printed circuit boards of this type, with four copper layers, has a permissible maximum temperature of about 110° C. Although alternative materials with a higher permissible maximum temperature are available, they are very expensive.

Instead of the soldered connection mentioned, it is also possible in principle to use a bonded connection, for example of gold or aluminum. However, bonded connections of this type also have relatively low permissible maximum temperatures of approximately 150° C. in the case of gold and approximately 175° C. in the case of aluminum as bonding materials.

SUMMARY

The present invention provides a semiconductor device with which the heat dissipated via a specific terminal contact is limited to a predetermined value.

In one embodiment, the semiconductor device according to the invention includes a semiconductor chip on which a terminal contact formed in one flat piece, a patterned metallization layer, contacting the terminal contact, and a preferably likewise patterned connecting layer are successively arranged. The patterned metallization layer and the connecting layer thereby form an electrically conducting contact layer.

By means of this contact layer it is possible to bring the semiconductor chip into electrically conducting contact with a carrier, for example with a chip carrier belonging to the semiconductor device, or with a printed circuit board not belonging to the semiconductor device. The patterning of the contact layer formed by the metallization layer and the connecting layer has the effect that the contact area for establishing the electrically conducting connection of the terminal contact to the carrier is reduced in comparison with a full-area contact layer. The patterning of the metallization allows the maximum achievable heat transfer from the semiconductor chip to the connecting layer or the chip carrier to be set in a specifically selective manner.

In one embodiment, the thermal transfer resistance of the patterned metallization layer increases with increasing thickness of the metallization layer and with increasing ratio of the maximum possible contact area and the actual contact area. Typical values for the ratio of the maximum possible contact area, that is the area of the terminal contact, and the actual contact area lie between 2:1 and 50:1, preferably between 2:1 and 10:1. The ratio may, however, also be chosen to be greater and lie between 10:1 and 50:1.

As a result of the patterning of at least the metallization layer, the contact layer formed by the metallization layer and the connecting layer has clearances which are fully or partially filled either with air or with a thermally poorly conducting material, for example an imide. If these clearances are filled with a solid material, this material forms a likewise patterned, thermally insulating layer, which is applied to the terminal contact. The material of the thermally insulating layer is in this case chosen such that its specific thermal conductivity is less than the specific thermal conductivity of the patterned contact layer.

The patterned contact layer is intended for the purpose of connecting the terminal contact in an electrically conducting manner to a carrier. This carrier may be formed, for example, as a chip carrier or as a printed circuit board (PCB).

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 6 illustrates a vertical section through a further semiconductor device according to the invention which has no chip carrier and is mounted on a printed circuit board.

FIG. 7 illustrates a horizontal section through the patterned metallization layer of the semiconductor device according to the invention as shown in FIG. 6.

DETAILED DESCRIPTION

Figure 1:
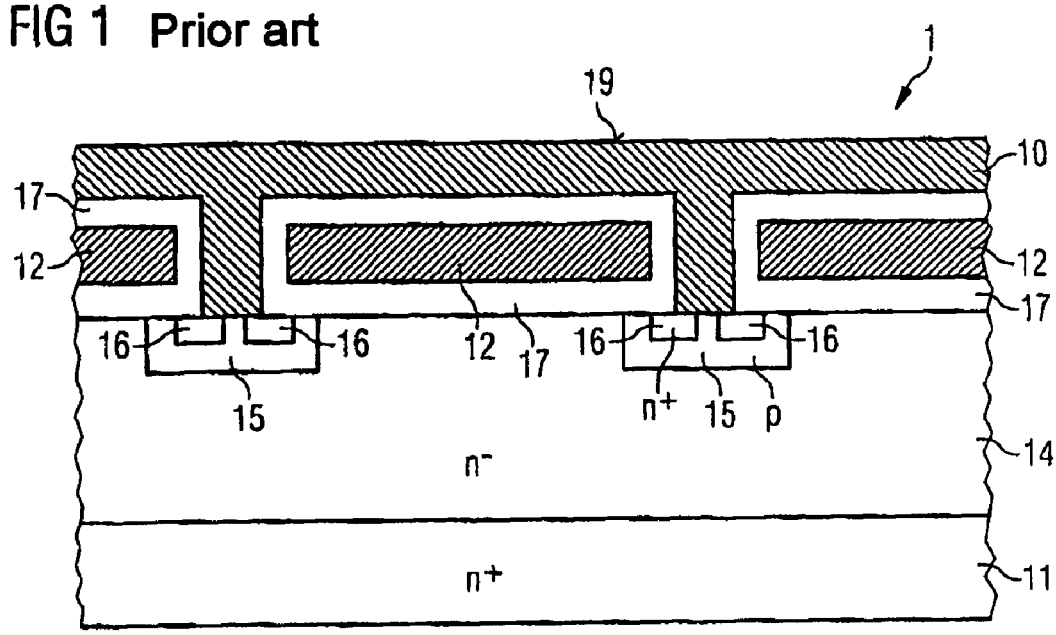
FIG. 1 illustrates a cross section through a portion of a semiconductor chip with a metallization formed in one piece according to the prior art.

Unless otherwise specified, in the figures the same reference numerals designate the same parts with the same meaning.

Figure 2:
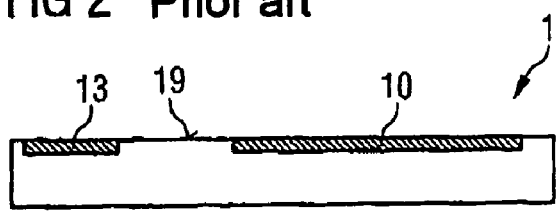
FIG. 2 illustrates a reduced representation of a cross section through the complete semiconductor chip as shown in FIG. 1.
Figure 3:
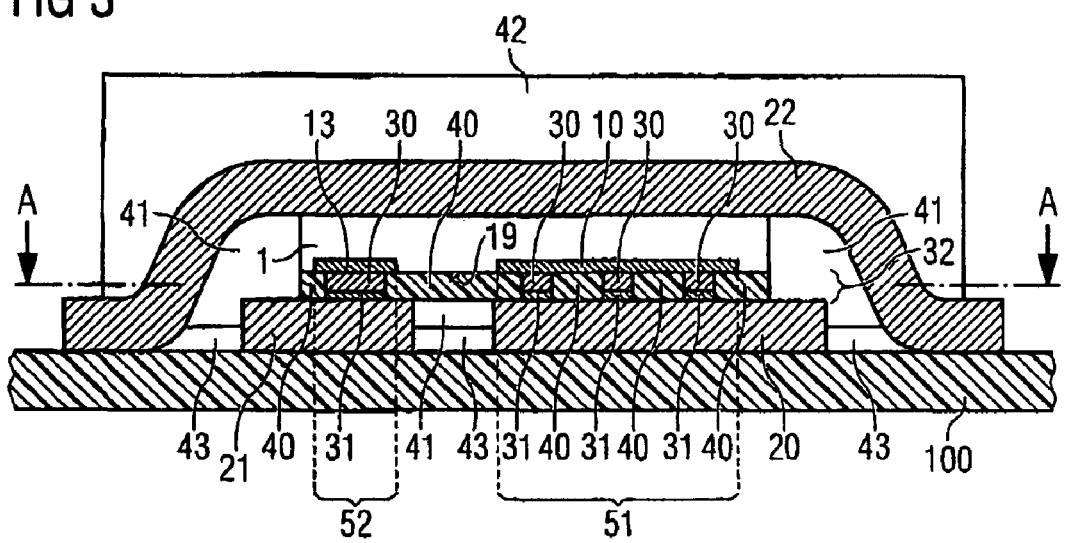
FIG. 3 illustrates a vertical section through a semiconductor device according to the invention with a divided chip carrier which is mounted on a printed circuit board.

FIG. 3 illustrates a vertical section through a semiconductor device according to one embodiment of the invention. This semiconductor device comprises a semiconductor chip 1, on the front side 19 of which a terminal contact 10, preferably of a flat form, is arranged. An optional further terminal contact 13, which in the present exemplary embodiment represents a control terminal of the semiconductor chip 1, is likewise arranged on the front side 19 of the semiconductor chip 1. The terminal contacts 10 and 13 are formed for example as metallizations, for example of aluminum. The semiconductor chip 1 with the terminal contacts 10 and 13 corresponds for example to a semiconductor chip as in FIG. 2, but is turned in comparison with the latter by 180° into a flip-chip position.

The device realized in the semiconductor chip 1 may be any desired semiconductor devices, for example MOSFETs or IGBTs, which have at least one terminal contact 10. The construction of the semiconductor device according to the invention is relevant in particular for power semiconductor devices, since with these the power losses occurring and the temperatures thereby induced are particularly high.

According to one embodiment of the invention, a patterned metallization layer 30 and a connecting layer 31 are arranged on the terminal contact 10 of the semiconductor chip 1. The connecting layer 31 may be both unpatterned and patterned. It is preferred for the patterned metallization layer 30 and the connecting layer 31 to be identically patterned—as represented.

The metallization layer 30 and the connecting layer 31 together form an electrically conducting contact layer 32, the task of which is to connect the terminal contact 10 to a chip carrier. In the example that is in FIG. 3, the terminal contact 10 is connected to a first chip carrier part 20 of a divided chip carrier, having two chip carrier parts 20, 21.

As a result of the patterning of the metallization layer 30 and the connecting layer 31, clearances are formed in the contact layer 32 and may be fully or partially filled either with air or a gas, for example an inert gas, or as represented with an insulator of thermally insulating material. A thermally insulating material may comprise both organic materials, such as for example an imide or a molding compound, or inorganic materials, such as for example an oxide, in particular a metal oxide or a semiconductor oxide, or be formed from these materials. Instead of solid materials, a gas, for example air or an inert gas, may also be used as the thermally insulating material.

The insulator arranged in the clearances of the patterned contact layer 32 consequently forms a patterned insulator layer 40, which is arranged in particular on the terminal contact 10. It is preferred for this patterned insulator layer 40 to extend in the lateral direction over the entire width of the semiconductor chip 1. In the vertical direction, it is preferred for the patterned insulator layer 40 to extend from the front side 19 of the semiconductor chip 1 either up to the interface between the patterned metallization layer 30 and the patterned connecting layer 31 or up to the side of the patterned connecting layer 31 that is facing away from the front side 19. In principle, however, all other thicknesses of the insulator layer 40 up to the thickness of the contact layer are also permissible.

If it is formed from solid material, the patterned insulator layer 40 serves in particular for the purpose of preserving the patterning of the patterned metallization layer 30 if the patterned metallization layer 30 comprises melting metals or alloys for which there is the risk that they will be heated above their melting point and be melted, for example during soldering. Without a patterned insulator layer 40, the original patterning of the metallization layer 30 would then be lost.

As a result of the thermally insulating properties of the insulator layer 40, the heat flux responsible for the heating of the first chip carrier part 20 flows substantially from the terminal contact 10 via the region of the patterned contact layer 32 that connects the terminal contact 10 to the first chip carrier part 20 in an electrically conducting manner.

The patterned metallization layer 30 and optionally also the patterned connecting layer 31 are already created during the production of the semiconductor chip 1. If in this case the front side 19 of the semiconductor chip 1 has a number of terminal contacts insulated from one another—in the exemplary embodiment the terminal contacts 10 and 13—there is a dedicated contact layer for each of these terminal contacts 10, 13. These contact layers are insulated from one another and represented in FIG. 3 as portions 51, 52 of the contact layer 30, 31.

The respective portions 51, 52 are laterally delimited by the lateral dimensions of the terminal contact 10, 13 concerned. The first and the second portion 51, 52 of the patterned contact layer 30 are electrically insulated from each other, the first portion 51 connecting the terminal contact 10 to the first chip carrier part 20 in an electrically conducting manner and the second portion 52 connecting the terminal contact 13 to the second chip carrier part 21 in an electrically conducting manner.

In the same way as a contact bridge 22, which contacts the back side of the semiconductor chip 1 opposite from the front side 19, the chip carrier parts 20 and 21 connected to the terminal contacts 10, 13 in an electrically conducting manner serve for contacting the semiconductor device from the outside. In the present exemplary embodiment, the first chip carrier part 20 is at source potential and the contact bridge 22 is at drain potential. The second chip carrier part 22 correspondingly forms the gate terminal.

In order to protect the semiconductor chip 1 from penetrating moisture and contamination, the semiconductor chip 1 is surrounded at least partly by a passivation layer 41. It is preferred for this passivation layer 41 also partly to enclose the first and second chip carrier parts 20, 21, in order to stabilize them mechanically. Furthermore, the semiconductor device is optionally surrounded by a molding compound 42, which forms the housing of the semiconductor device.

The same or different materials may be used for the thermal insulator layer 40, the passivation layer 41 and the molding compound 42. For the passivation layer 41, materials with a low specific thermal conductivity are suitable with preference. In principle, the material of the insulator layer 40 may also be electrically conducting, but it must then be ensured that no short-circuits are produced between the terminal contacts 10 and 13 or disturbing leakage currents form.

If a thermally insulating, but electrically conducting insulator layer 40 contacts a number of terminal contacts 10, 13 of the semiconductor chip 1, it is preferably patterned in such a way that it has at least two regions which are spaced apart from each other and electrically insulated from each other. In this case, the one region is connected in an electrically conducting manner to the terminal contact 10 and the other is connected in an electrically conducting manner to the terminal contact 30.

The semiconductor device represented in FIG. 3 is soldered onto a printed circuit board 10 using the chip carrier. In principle, any substrate provided with a metallization, such as for example a PCB (PCB=Printed Circuit Board) or a ceramic substrate is suitable as the printed circuit board 100.

Figure 5:
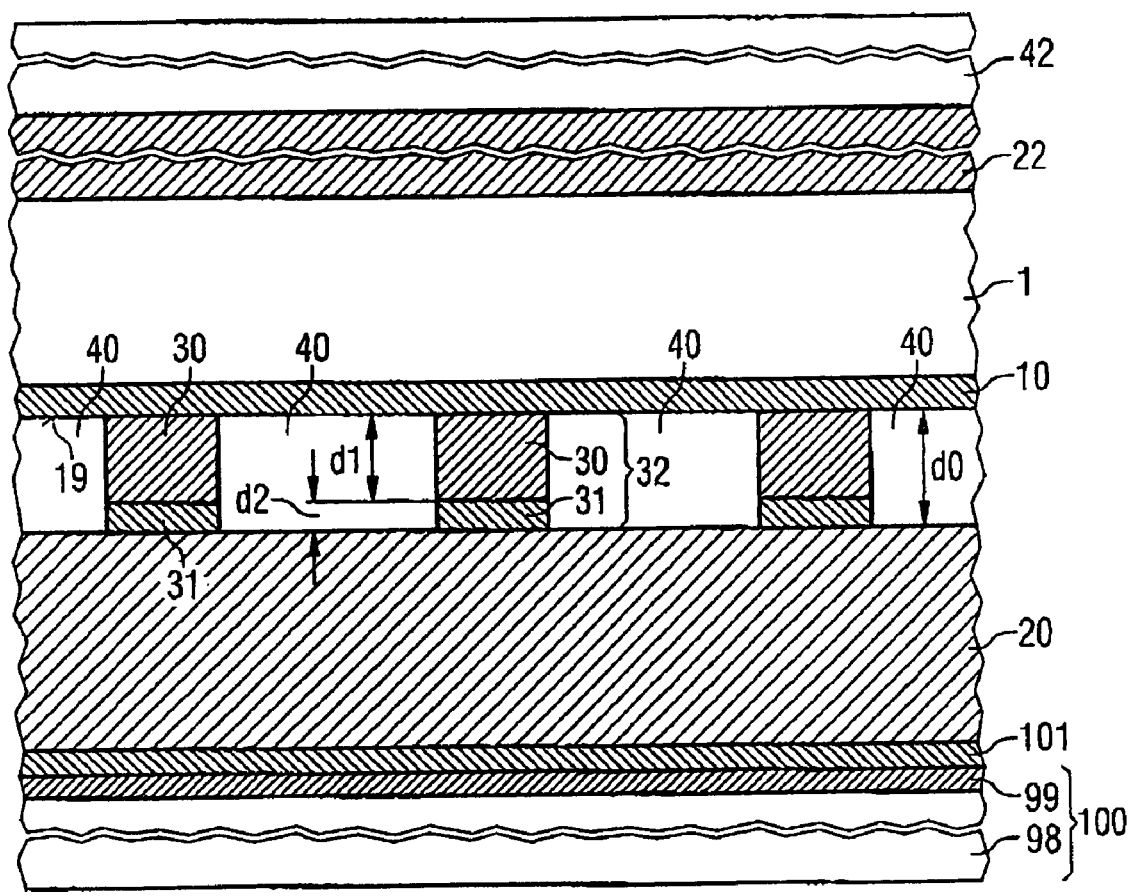
FIG. 5 illustrates a cross section through an enlarged cutout of the semiconductor device according to the invention as illustrated in FIG. 3.

An enlarged cutout of the semiconductor device according to the invention as illustrated FIG. 3 is represented in FIG. 5. The portion shows the semiconductor chip 1, on the front side 19 of which a metallization 10 has been applied. This metallization 10 is connected in an electrically conducting manner to a first chip carrier part 20. This electrically conducting connection is established by a contact layer 32 of the thickness d0, which comprises the patterned metallization layer 30 with the thickness d1 and the patterned connecting layer 31 with the thickness d2. On the side of the first chip carrier part 20 that is facing away from the semiconductor chip 1, the semiconductor device is connected in an electrically conducting manner to the metallization 99 of a printed circuit board 100 by means of a solder layer 101.

A limitation of the heat flux from the terminal contact 10 to the first chip carrier part 20 can be brought about along with the degree of patterning of the patterned metallization layer 30 also by means of the thickness d1 of the latter. The heat flux thereby decreases with increasing thickness d1 of the patterned metallization 10. The thicknesses d1 of the patterned metallization layer 30 preferably lie above 10 μm, with particular preference between 10 μM and 100 μm. Suitable materials for the patterned metallization layer 30 are metals that remains solid, such as for example aluminum, copper, nickel, titanium, silver, gold and chromium. Alternatively, the patterned metallization layer 30 may also be formed by melting metal layers, such as for example tin (Sn), bismuth (Bi) or alloys of tin/silver (AgSn), tin/gold (AuSn), tin/lead (PbSn), bismuth/lead (BiSn), gold/silicon (AuSi), gold/germanium (AuGe) or silver/indium (AgIn). For the purposes of this application, metals or alloys with a melting point of less than or equal to 400° C. are considered as melting. In a corresponding way, metals or alloys with a melting point of over 400° C. are regarded as remaining solid.

Similarly, combinations of metals that remain solid and metals that melt are also possible. For example, the patterned metallization layer 30 may be formed by a number of sub-layers that remain solid and/or sub-layers that melt of in each case any desired metal or any desired alloy, metals or alloys that remain solid and those that melt preferably being arranged alternately in succession. In this case, the patterned metallization layer 30 has at least one, with preference one to ten, sub-layers.

For the patterned metallization layer 30 it is preferred to use a material which has good electrical conduction and a melting point which is higher than the melting point of the solder layer 101. If the patterned connecting layer 31 is likewise formed as a solder layer, for example from a diffusion solder, it is preferred for the melting point of the patterned metallization layer 30 to be higher than the melting point of the patterned connecting layer 31. The melting point of the patterned metallization layer 30 preferably lies above 260° C. Conversely, the patterned metallization layer 30 may be formed for example from a diffusion solder and the connecting layer 31 from a metal that remains solid, so that during soldering initially the diffusion solder melts, so that the metal of the connecting layer 31 that normally remains solid likewise melts under the effect of the diffusion solder and is connected for example to the first chip carrier part 20 or the metallization of a printed circuit board.

The patterned connecting layer 31 may also be used in the same way as the patterned metallization layer 30, i.e., by its thickness, its degree of patterning and the material used, for limiting the heat flux from a terminal contact to a chip carrier 20, 21 or to a printed circuit board 100.

Figure 4:
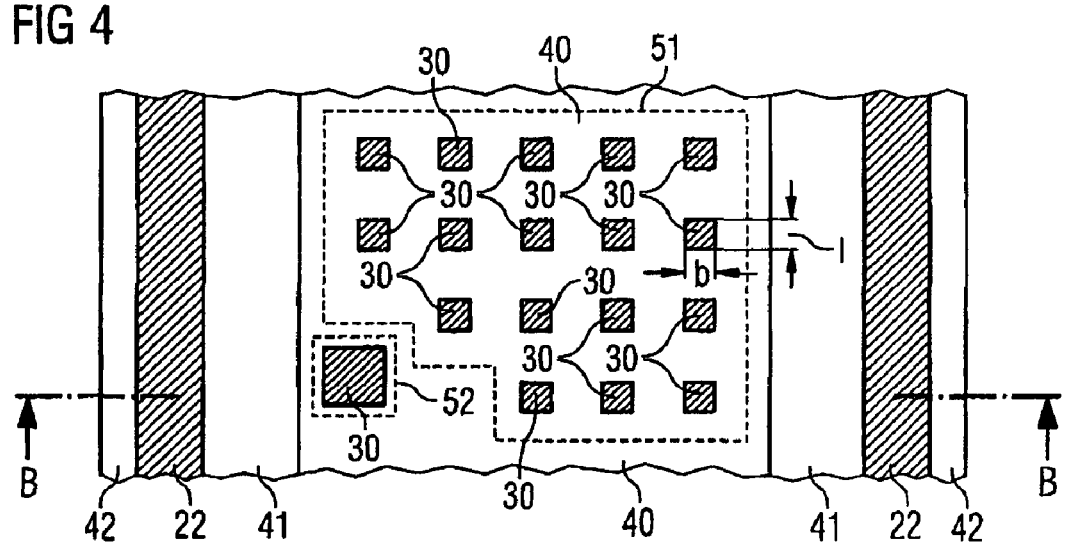
FIG. 4 illustrates a horizontal section through the patterned metallization layer of the semiconductor device according to one embodiment of the invention as illustrated in FIG. 3.

FIG. 4 illustrates a horizontal section through the patterned metallization layer 30 of the semiconductor device according to the invention as shown in FIG. 3 in a plane A represented there. Represented by dashed lines are the projections 51, 52 of the terminal contacts 10 and 13 arranged above the sectional plane shown. These portions 51, 52 that are represented by dashed lines identify the portions 51, 52 of the patterned metallization layer 30 that can be contacted as a maximum by the terminal contacts 10, 13 concerned.

In principle, the terminal contact 10 may be contacted in an electrically conducting manner with the first chip carrier part 20 over its entire surface area. Since, however, the contacting takes place by means of the metallization layer 30 and since the latter is also patterned within the lateral limits of the terminal contact 10, that is within the portion of the metallization layer 30 delimited by the dashed line 51, the actual contact area is reduced in comparison with the maximum possible contact area.

In the present exemplary embodiment, by way of example, the patterned metallization layer 30 has within its portion 51 that is represented by dashed lines 17 identical rectangular islands, spaced apart from one another in pairs, of the width b and the length l. The electrical contacting of the terminal contact 10 with the first chip carrier part 20 represented in FIG. 3 takes place by means of these 17 islands. The actual contact area is 17*b*l and is consequently reduced in comparison with the maximum possible contact area, whereby the heat transfer from the region of the terminal contact 10 to the connecting layer 31 and the first chip carrier part 20 is also reduced. The ratio between the maximum possible contact area and the actual contact area is consequently greater than 1, with preference greater than 10. Particularly preferred values of this ratio lie between 10 and 50.

In the present exemplary embodiment, the portion of the patterned metallization layer 30 that is arranged within the region 52 represented by dashed lines contacts the terminal contact 13 represented in FIG. 3 with the second chip carrier part 21, likewise shown in FIG. 3. The patterning of the metallization layer 30 has the effect that clearances are present within the metallization layer 30 and it is preferred that they are at least partially filled with thermally insulating material, for example an imide. It is particularly preferred for the thermally insulating material to form an insulating layer 40, which extends in the lateral direction substantially up to the edges of the semiconductor chip 1.

The view of the semiconductor device according to the invention that is represented in FIG. 3 corresponds to a vertical section through the plane B represented in FIG. 4.

FIG. 6 illustrates a vertical section through a further preferred exemplary embodiment of a semiconductor device. The view represented corresponds to a cross section through the semiconductor device according to FIG. 7 in the plane D represented there.

The construction of the semiconductor chip 1 corresponds substantially to the construction already known from FIGS. 2 and 3. The semiconductor devices according to FIGS. 3 and 6 differ in particular in that the semiconductor device according to FIG. 3 has a first chip carrier part 20 and a second chip carrier part 21, which are respectively connected in an electrically conducting manner to the terminal contact 10 and the terminal contact 13. As a difference from this, the semiconductor device according to FIG. 6 has no corresponding chip carrier parts. Rather, the connecting layer 31 of the semiconductor device according to the invention that is connected to a printed circuit board 100 is connected directly to a metallization (not represented in any more detail) of the printed circuit board 100.

This connection may be formed for example as a soldered connection or as a bonded connection. In the case of a soldered connection, the connecting layer 31 is formed from a solder, for example a diffusion solder, with preference a soft solder such as for example a lead-tin solder. In the case of a bonded connection, on the other hand, the connecting layer 31 consists with preference of a bonding metal, for example gold, aluminum or an alloy of these metals.

The connecting layer 31 may also be used furthermore as protection against oxidation or to optimize wetting. Suitable in particular as protection against oxidation are precious metals, for example gold, silver or alloys of these metals. Optimization of wetting can be achieved with melting metals, with preference with tin or tin alloys. Similarly, a combination of protection against oxidation and optimization of wetting is possible, if the connecting layer 31 comprises alloys of a precious metal and a melting metal. Particularly preferred for these are alloys of gold and tin or of silver and tin.

A horizontal section through this semiconductor device in a plane C in the region of the patterned metallization layer 30 is represented in FIG. 7. The representation corresponds to the representation already known from FIG. 4. Differences exist only in that the contact bridge 22 of the semiconductor device according to FIG. 7 has a different geometry and that, in the case of the semiconductor device according to FIG. 7, the molding compound forming the housing does not extend up to the sectional plane represented. As in the case of all devices according to the invention, a housing, for example of a molding compound 42, is optional. If the semiconductor device has no housing or if a housing is cut open at a suitable location, it is possible for example for the contact bridge 22 to be contacted with a heat sink in the regions not covered by a housing.

Figure 8:
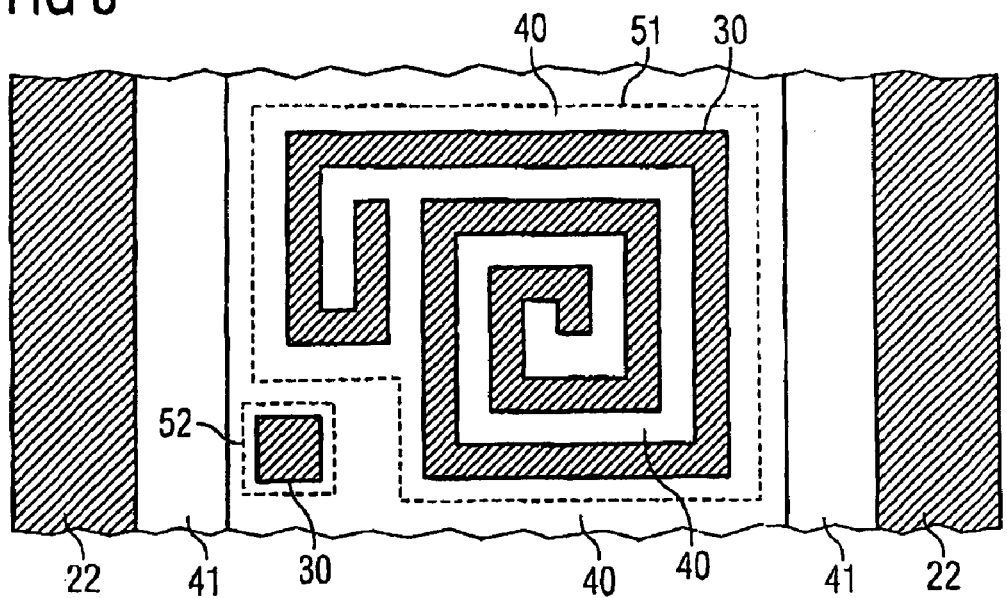
FIG. 8 illustrates a horizontal section through the patterned metallization layer of a semiconductor device according to the invention, in the case of which the portion of the patterned metallization that is connected in an electrically conducting manner to a terminal contact is formed in one piece.

FIG. 8 illustrates a further exemplary embodiment of a semiconductor device according to the invention. In a way similar to FIGS. 4 and 7, the representation shows a horizontal section in the region of the patterned metallization layer 30. Unlike in the case of the semiconductor devices according to FIGS. 4 and 7, the patterned metallization layer 30 is formed in one piece within the region 51 represented by dashed lines. In a way similar to in the case of the previous exemplary embodiments, a portion 51 of the patterned metallization layer 30 represents the maximum possible contact area of a terminal contact corresponding to the terminal contact 10 known from FIGS. 3 and 6. The actual contact area is smaller than the maximum possible contact area and corresponds to the area of the patterned metallization layer 30 within the portion 51. For the ratio of the maximum possible contact area to the actual contact area, the values already mentioned in the description relating to FIG. 4 apply.

Figure 9:
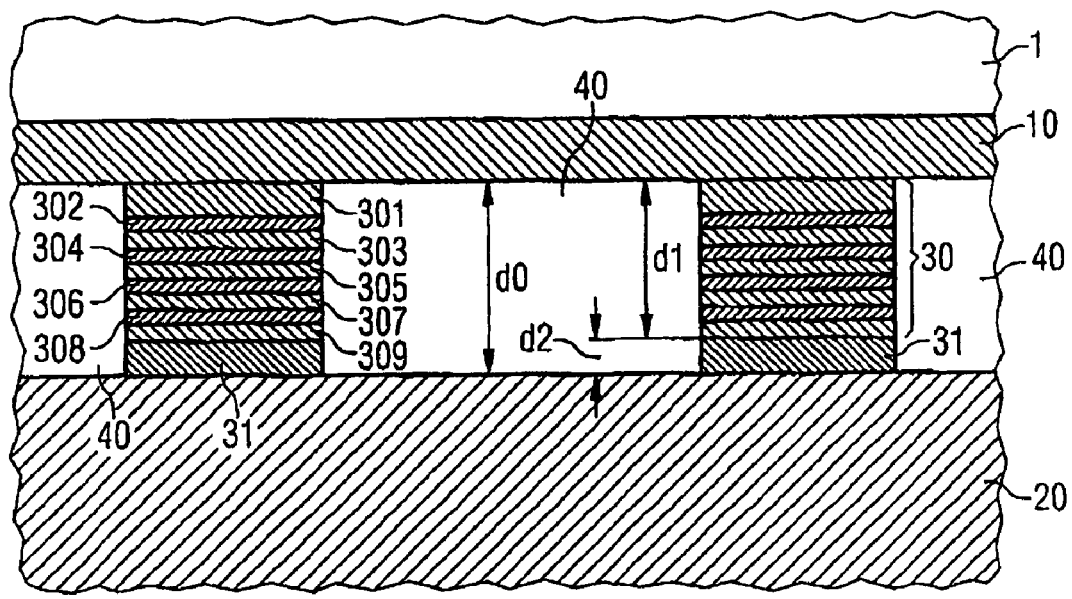
FIG. 9 illustrates an enlarged cutout of the semiconductor device according to the invention, in the case of which the patterned metallization layer comprises a number of sublayers.

A preferred embodiment of a semiconductor device according to the invention is shown in FIG. 9. The patterned metallization layer 30 with a thickness d1 comprises a number of sub-layers 301-309, the total number of which is in principle as desired and lies with preference between 1 and 10.

According to a preferred embodiment, the sub-layers 301, 303, 305, 307 and 309 remain solid, that is to say have a melting point of over 400° C., while the sub-layers 302, 304, 306 and 308 melt, and correspondingly have a melting point of less than or equal to 400° C.

In this case, the patterned sub-layer 301 that remains solid is initially applied, and then the sub-layers 302, 303, 304, 305, 306, 307, 308 and 309 are successively applied to the terminal contact 10, so that sub-layers that melt and sub-layers that remain solid alternate with one another.

The sub-layer closest to the terminal contact 10 may be—as represented in the case of the sub-layer 301—a sub-layer that remains solid or alternatively a sub-layer that melts. The sub-layer closest to the connecting layer 31 may also be—like the sub-layer 309 represented—one that remains solid, or alternatively also one that melts.

In principle, however, it is also possible for two or more sub-layers that remain solid to be adjacent each other. The same similarly applies to two or more sub-layers that melt. Furthermore, different sub-layers may have both the same and different thicknesses.

The sub-layer 309 and the first chip carrier part 20 are connected to each other by a connecting layer 31 of the thickness d2 arranged between them.

The distance d0 between the terminal contact 10 and the chip carrier 20 is determined in particular by the thickness d1 of the patterned metallization layer 30 and by the thickness d2 of the connecting layer 31. The thermal transfer resistance between the terminal contact 10 and the first chip carrier part 20 and also a printed circuit board connected to the chip carrier part 20 can be set by the distance d0 and by the selection of the materials forming the patterned metallization layer 30 and the connecting layer 31. The same also correspondingly applies to the thermal transfer resistance between the terminal contact 10 and a printed circuit board connected to the latter if the semiconductor device has no chip carrier—such as for example the semiconductor device according to FIG. 6.

The invention claimed is:

1. A semiconductor device with a semiconductor chip, comprising:
    a terminal contact formed in one piece;
    an insulator layer;
    a patterned metallization layer comprising a plurality of metallization portions, the patterned metallization layer having a thickness between 10 μm and 100 μm, wherein the plurality of metallization portions are separated from one another by the insulator layer to form a composite shape having a desired pattern and are electrically conductively connected to the terminal contact; and
    a patterned connecting layer successively arranged with the patterned metallization layer and comprising a plurality of connecting portions, wherein the plurality of connecting portions are arranged relative to one another to form a composite shape having the desired pattern so that each connecting portion aligns with a corresponding metallization portion such that the patterned metallization layer and the patterned connecting layer form an electrically conducting contact layer,
    wherein the semiconductor chip is configured for flip-chip mounting,
    wherein the terminal contact is arranged on a side of the electrically conducting contact layer facing the semiconductor chip,
    wherein the patterned metallization layer has successively arranged planar sub-layers, sidewalls of each sub-layer aligned with sidewalls of each other sub-layer and the sidewalls of each sub-layer perpendicular to the terminal contact, and
    wherein of two sub-layers respectively adjacent each other, one has a melting point of less than or equal to 400° C. and the other has a melting point of over 400° C.

2. The semiconductor device of claim 1, wherein the ratio between the areas of the terminal contact and the combined area of each of the metallization portions of the patterned metallization layer is greater than 2:1, wherein the area of the terminal contact represents a maximum possible contact area and the combined area of each of metallization portions represents an actual contact area.

3. The semiconductor device of claim 2, wherein the ratio is between 2:1 and 10:1.

4. The semiconductor device of claim 2, wherein the ratio is between 10:1 and 50:1.

5. The semiconductor device of claim 1, wherein the patterned connecting layer is formed from a solder or a bonding metal.

6. The semiconductor device of claim 1, wherein the connecting layer has a melting point of less than or equal to 400° C.

7. The semiconductor device of claim 1, further comprising:
    a contact bridge electrically conductively connecting to a first side of the semiconductor chip, the contact bridge extending from the first side of the semiconductor chip past a second side of the semiconductor chip opposite the first side of the semiconductor chip; and
    a chip carrier electrically conductively connecting to the patterned connecting layer, the chip carrier configured to be coupled to a printed circuit board,
    wherein the terminal contact is formed on the second side of the semiconductor chip,
    wherein sidewalls of each metallization portion are aligned with sidewalls of each corresponding connecting portion, and
    wherein a thermally insulating insulator layer laterally surrounds the plurality of connecting portions.

8. A semiconductor device with a semiconductor chip, comprising:
    a terminal contact;
    a patterned, thermally insulating insulator layer;
    a patterned metallization layer comprising a plurality of metallization portions, the patterned metallization layer having a thickness between 10 μm and 100 μm, wherein the plurality of metallization portions are separated from one another by the patterned, thermally insulating insulator layer to form a composite shape having a desired pattern and are electrically conductively connected to the terminal contact; and
    a patterned connecting layer successively arranged with the patterned metallization layer and comprising a plurality of connecting portions, wherein the plurality of connecting portions are arranged relative to one another to form a composite shape having the desired pattern such that sidewalls of each connecting portion align with sidewalls of a corresponding metallization portion, wherein the patterned metallization layer and the patterned connecting layer form an electrically conducting contact layer;
    wherein the patterned, thermally insulating insulator layer arranged on the terminal contact in clearances about the plurality of metallization portions of the patterned metallization layer;
    wherein the semiconductor chip is configured for flip-chip mounting;
    wherein the terminal contact is arranged on a side of the electrically conducting contact layer facing the semiconductor chip;
    wherein the patterned metallization layer has successively arranged planar sub-layers, sidewalls of each sub-layer aligned with sidewalls of each other sub-layer and the sidewalls of each sub-layer perpendicular to the terminal contact; and
    wherein of two sub-layers respectively adjacent each other, one has a melting point of less than or equal to 400° C. and the other has a melting point of over 400° C.

9. The semiconductor device of claim 8, wherein the patterned, thermally insulating insulator layer has a specific thermal conductivity less than a specific thermal conductivity of the contact layer.

10. The semiconductor device of claim 8, wherein the patterned, thermally insulating insulation layer comprises at least one of a group consisting of a molding compound, an oxide, a metal oxide, a semiconductor oxide, and an inert gas or air.

11. A semiconductor device with a semiconductor chip, comprising:
- a terminal contact formed in one piece;
- an insulator layer;
- a patterned metallization layer formed so as to comprise a plurality of metallization portions, the patterned metallization layer having a thickness between 10 μm and 100 μm, wherein the plurality of metallization portions are separated from one another by the insulator layer to form a desired pattern and are electrically conductively connected to the terminal contact; and
- a patterned connecting layer successively arranged with the patterned metallization layer and formed so as to comprise a plurality of connecting portions, wherein the plurality of connecting portions are arranged relative to one another to form a composite shape having the desired pattern so that each connecting portion aligns with a corresponding metallization portion such that the patterned metallization layer and the patterned connecting layer form an electrically conducting contact layer, wherein the contact layer and the terminal contact are connected in an electrically conducting manner to a chip carrier, the chip carrier configured to be coupled to a printed circuit board,
- wherein the semiconductor chip is configured for flip-chip mounting,
- wherein the terminal contact is arranged on a side of the electrically conducting contact layer facing the semiconductor chip,
- wherein the patterned metallization layer has successively arranged planar sub-layers, sidewalls of each sub-layer aligned with sidewalls of each other sub-layer and the sidewalls of each sub-layer perpendicular to the terminal contact, and
- wherein of two sub-layers respectively adjacent each other, one has a melting point of less than or equal to 400° C. and the other has a melting point of over 400° C.

12. The semiconductor device of claim 11, wherein a distance between the terminal contact and the carrier is greater than 10 μM.

13. A semiconductor device with a semiconductor chip, comprising:
- a terminal contact formed in one piece;
- an insulator layer;
- a patterned metallization layer comprising a plurality of metallization portions, the patterned metallization layer having a thickness between 10 μm and 100 μm, wherein the plurality of metallization portions are separated from one another by the insulator layer to form a composite shape having a desired pattern and are electrically conductively connected to the terminal contact;
- a patterned connecting layer successively arranged with the patterned metallization layer and comprising a plurality of connecting portions, wherein the plurality of connecting portions are arranged relative to one another to form a composited shape having the desired pattern so that each connecting portion aligns with a corresponding metallization portion such that the patterned metallization layer and the patterned connecting layer form an electrically conducting contact layer;
- wherein the patterned metallization layer has successively arranged planar sub-layers, sidewalls of each sub-layer aligned with sidewalls of each other sub-layer and the sidewalls of each sub-layer perpendicular to the terminal contact;
- wherein the semiconductor chip is configured for flip-chip mounting;
- wherein the terminal contact is arranged on a side of the electrically conducting contact layer facing the semiconductor chip;
- wherein of two sub-layers respectively adjacent each other, one has a melting point of less than or equal to 400° C. and the other has a melting point of over 400° C.

14. The semiconductor device of claim 13, wherein the patterned metallization layer has at least one and at most ten sub-layers.

15. A semiconductor device, comprising:
- a semiconductor chip;
- a terminal contact on a first side of the semiconductor chip;
- an insulator layer;
- a metallization means for electrically conductively connecting to the terminal contact, the metallization means having a thickness between 10 μm and 100 μm; the metallization means including a plurality of metallization portions, wherein the plurality of metallization portions are separated from one another by the insulator layer to form a composite shape having a desired pattern;
- a connecting means successively arranged with the metallization means and comprising a plurality of connecting portions, wherein the plurality of connecting portions are arranged to form a composite shape having the desired pattern so that each connection portion aligns with a corresponding metallization portion such that the metallization means and the connecting means form an electrically conducting contact means; and
- a contact bridge electrically conductively connecting to a second side of the semiconductor chip opposite the first side of the semiconductor chip,
- wherein the semiconductor chip is configured for flip-chip mounting,
- wherein the terminal contact is arranged on a side of the electrically conducting contact means facing the semiconductor chip,
- wherein the metallization means has successively arranged planar sub-layers, sidewalls of each sub-layer aligned with sidewalls of each other sub-layer and the sidewalls of each sub-layer perpendicular to the terminal contact, and
- wherein of two sub-layers respectively adjacent each other, one has a melting point of less than or equal to 400° C. and the other has a melting point of over 400° C.

16. A semiconductor device with a semiconductor chip, comprising:
- a terminal contact formed in one piece;
- an insulating layer;
- a patterned metallization layer formed in one piece and comprising a plurality of metallization portions separated from one another by the insulating layer to form a desired pattern and electrically conductively connecting to the terminal contact, the patterned metallization layer having a thickness between 10 μm and 100 μm;
- a patterned connecting layer successively arranged with the patterned metallization layer and comprising a plurality of connecting portions arranged to form the desired pattern so that each connecting portion aligns with a corresponding metallization portion such that the patterned metallization layer and the patterned connecting layer form an electrically conducting contact layer;
- wherein the insulating layer comprising a plurality of insulating portions is arranged in the clearances of the patterned connecting layer;

wherein the desired pattern is formed by arranging metallization portions relative to one another to form a contiguous composite shape and arranging connecting portions relative to one another to form the contiguous composite shape;

wherein the semiconductor chip is configured for flip-chip mounting;

wherein the terminal contact is arranged on a side of the electrically conducting contact layer facing the semiconductor chip;

wherein the patterned metallization layer has successively arranged planar sub-layers, sidewalls of each sub-layer aligned with sidewalls of each other sub-layer and the sidewalls of each sub-layer perpendicular to the terminal contact; and wherein of two sub-layers respectively adjacent each other, one has a melting point of less than or equal to 400° C. and the other has a melting point of over 400° C.

* * * * *